(12) United States Patent
Pagani

(10) Patent No.: US 9,442,159 B2
(45) Date of Patent: Sep. 13, 2016

(54) TESTING INTEGRATED CIRCUITS USING FEW TEST PROBES

(71) Applicant: STMicroelectronics S.r.l., Agrate Brianza (MI) (IT)

(72) Inventor: Alberto Pagani, Nova Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 678 days.

(21) Appl. No.: 13/716,018

(22) Filed: Dec. 14, 2012

(65) Prior Publication Data

US 2013/0120012 A1 May 16, 2013

Related U.S. Application Data

(60) Division of application No. 12/398,148, filed on Mar. 4, 2009, now Pat. No. 8,362,796, and a continuation of application No. 12/982,753, filed on Dec. 30, 2010, now Pat. No. 8,358,147.

(30) Foreign Application Priority Data

Mar. 5, 2008 (IT) .............................. MI2008A0365

(51) Int. Cl.
*H01L 21/66* (2006.01)
*G01R 31/28* (2006.01)
*G01R 31/317* (2006.01)
*G01R 31/319* (2006.01)

(52) U.S. Cl.
CPC ....... *G01R 31/2841* (2013.01); *G01R 31/3172* (2013.01); *G01R 31/31905* (2013.01); *G01R 31/31926* (2013.01); *H01L 22/30* (2013.01); *H01L 2224/16* (2013.01); *H01L 2924/1461* (2013.01)

(58) Field of Classification Search
None
See application file for complete search history.

(56) References Cited

U.S. PATENT DOCUMENTS

| 1,465,395 | A | 8/1923 | Jammer |
| 4,626,775 | A | 12/1986 | Cho et al. |
| 6,466,007 | B1 | 10/2002 | Prazeres da Costa et al. |
| 6,756,777 | B2 * | 6/2004 | Prazeres da Costa ................... G06K 7/0095 324/762.02 |
| 6,917,213 | B2 | 7/2005 | Oosawa et al. |
| 7,679,391 | B2 | 3/2010 | Watanabe et al. |
| 7,960,189 | B2 | 6/2011 | Cauvet et al. |
| 7,960,995 | B2 * | 6/2011 | Asami .............. G01R 31/31924 324/762.01 |

FOREIGN PATENT DOCUMENTS

WO    WO 2007/010480 A2    1/2007

* cited by examiner

*Primary Examiner* — Paresh Patel
(74) *Attorney, Agent, or Firm* — Gardere Wynne Sewell LLP

(57) ABSTRACT

A method of testing integrated circuits, including establishing at least a first physical communication channel between a test equipment and an integrated circuit under test by having at least a first probe of the test equipment contacting a corresponding physical contact terminal of the integrated circuit under test; having the test equipment and the integrated circuit under test exchange, over said first physical communication channel, at least two signals selected from the group including at least two test stimuli and at least two test response signals, wherein said at least two signals are exchanged by means of at least one modulated carrier wave modulated by the at least two signals.

23 Claims, 11 Drawing Sheets

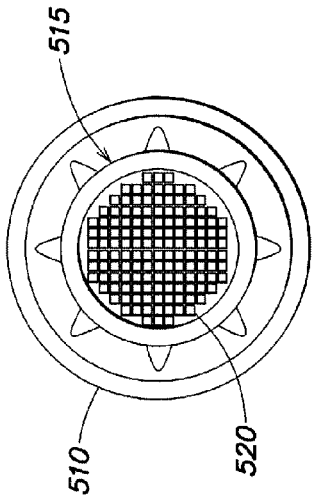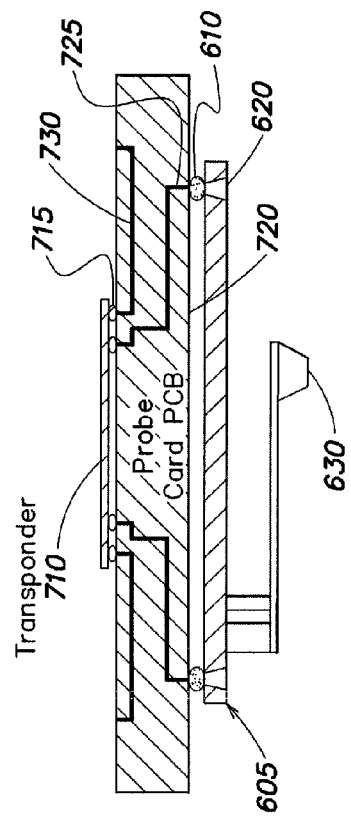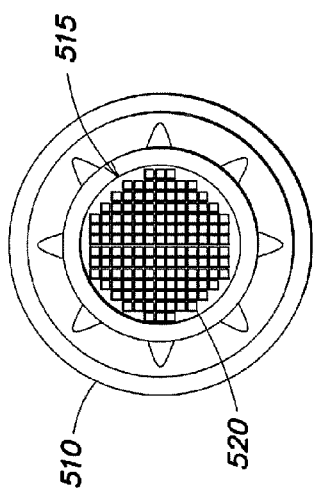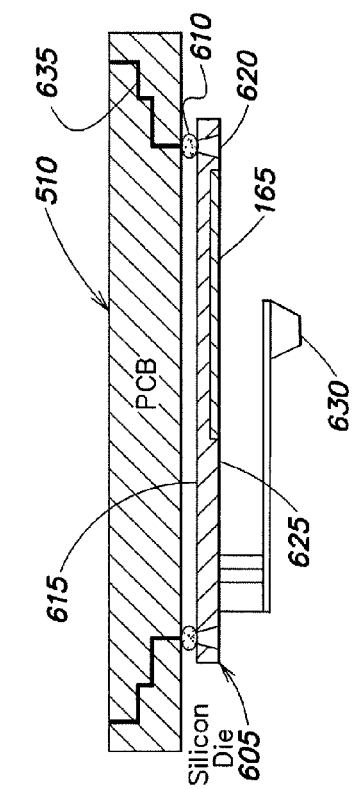
FIG. 6A
FIG. 6B
FIG. 7A
FIG. 7B

TESTING INTEGRATED CIRCUITS USING FEW TEST PROBES

CROSS REFERENCE TO RELATED APPLICATIONS

This application is a division of U.S. patent application Ser. No. 12/398,148, filed on Mar. 4, 2009, and also a continuation of U.S. patent application Ser. No. 12/982,753, filed Dec. 30, 2010, which applications claim the priority benefit of Italian patent application number MI2008A00365, filed on Mar. 5, 2008, which applications are hereby incorporated by reference to the maximum extent allowable by law.

BACKGROUND

1. Technical Field

The present invention relates to the field of Integrated Circuits (ICs), and particularly to methods and systems for IC testing.

2. Discussion of the Related Art

ICs are typically manufactured many at a time in the form of dies on a semiconductor material wafer. After manufacturing, the semiconductor wafer is diced, so as to obtain a plurality of individual IC chips.

Before being packaged and shipped to the customers, and installed in various electronic systems, the individual ICs need to be tested for assessing their functionality, and in particular for ensuring that they are not defective, that they respect prescribed specifications, and that they work properly. In particular, during the test, information regarding global or local physical faults (such as the presence of undesired short circuits and break-down events) of the IC integrated on each die are obtained, and, more generally, the proper operation thereof is detected (for example, by checking the waveform of one or more output signals of the IC in response to predetermined stimuli). Only those dies with ICs that meet predetermined requirements can proceed to the subsequent manufacturing phases (such as wire bonding, packaging and final testing).

According to a known testing technique, the IC dies are tested before the semiconductor wafer is diced into the individual chips. The test conducted at the wafer level is referred to as "wafer sort" or "Electrical Wafer Sort" ("EWS").

For example, in case of non-volatile semiconductor memory devices (such as Flash memories) the EWS test is performed on each die on which the memory device is integrated, in order to assess the correct operation thereof, e.g. to detect possible defective memory cells.

For performing the test, a tester is used which is coupled to the semiconductor wafer containing the IC dies to be tested, by means of a probe card which is used for interfacing the semiconductor wafer to the tester.

The tester is adapted to manage signals that are employed for performing the test. Hereinafter, such signals will be referred to as "test signals" and are intended to include test stimuli (e.g., commands, addresses of memory locations of the memory device to be accessed in read or write, data to be written into the memory device) which are generated by the tester and which are sent, by means of the probe card, to each die to be tested, and test response signals (e.g., data read from the memory device) which are generated by the ICs integrated on each die under test in response to the received test stimuli. The test response signals are sent by the IC integrated on each die under test to the tester, which processes them to derive an indication of the proper or improper operation of the ICs in the dies under test.

Often (for example during the EWS), the electrical coupling of the probe card with the ICs on the dies to be tested, necessary for achieving the signals exchange, is accomplished through probes adapted to establish a physical (mechanical and electrical) contact with corresponding contact pads on the ICs. For this purpose, the probe card consists of a PCB (Printed Circuit Board), which is connected to a large number (even of the order of some thousands) of mechanical probes, which are adapted to physically contact input/output contact pads of each die to be tested.

However, this type of test system has several limitations.

For example, there is the risk of damaging the contact pads of the dies under test. As known, a contact pad consists of an enlarged metallization region of the IC; when the tip of the mechanical probes touches the pads, there is always the risk that one or more of the pads are damaged by scrubbing, and the likelihood that this happens increases with the number of probes.

Also, the parallel-testing capability is relatively low: indeed, when several dies at a time have to be tested, the number of mechanical probes significantly increases; fabricating probe cards with many probes is not an easy task, and the finite dimensions of the probes pose a physical limit to the density of probes per unit area.

Moreover, the higher the number of probes required, the more probable it is that the electrical contacts between the pads of the ICs under test and the mechanical probes are not good, and electrical discontinuities may take place, which affect the test results.

Furthermore, when the contact pads are very close to each other (a situation frequently encountered due to the constant increase in integration scale and size shrinking), it is very difficult to ensure a good physical contact of the mechanical probes with the contact pads. Such a problem is emphasized when the pads are small in size and/or a large number thereof is present on each die.

In addition, the mechanical probes are very expensive, thus producing probe cards with several probes negatively contributes to the increase of the overall cost of the test system, and eventually of the ICs.

SUMMARY

The Applicant has tackled the problem of overcoming these and other problems.

The Applicant has found that a way to reduce the number of probes necessary to perform the test of an IC is to employ a mixing of multiple test stimuli and/or test response signals over a same physical communication channel between the probe card and an IC under test.

For example, according to an embodiment of the present invention, a frequency-division multiplexing scheme of the test signals is expediently exploited for reducing the number of input/output contact pads which to be contacted by probes during the testing of the ICs on the semiconductor wafer; in other words, in an embodiment of the present invention, signal carrier waves modulated at different operative frequencies may be used for sending to the ICs multiple test stimuli over a same, first communication channel, and for sending back to the tester multiple test response signals over a same, first or second communication channel, possibly coinciding with the first communication channel, thereby reducing the number of input/output contact pads which are used during the testing of the dies on the semiconductor wafer. For example, by exploiting different frequencies for different test stimuli to be fed to the IC under test, and/or for different test response signals generated by the IC (e.g., one frequency for a test stimulus, and another, different frequency for a test response signal), two or more test stimuli and test response signals can be exchanged using a same probe.

According to an aspect of the present invention, a method of testing integrated circuits is provided, comprising:

establishing at least a first physical communication channel between a test equipment and an integrated circuit under test by having a first probe of the test equipment contacting a corresponding physical contact terminal of the integrated circuit under test;

having the test equipment and the integrated circuit under test exchange, over said first physical communication channel, at least two signals selected from the group consisting of at least two test stimuli and at least two test response signal, wherein said at least two signals are exchanged by means of at least one modulated carrier wave modulated by the at least two signals.

According to another aspect of the present invention, a test equipment for testing integrated circuits is provided, comprising:

at least one first probe adapted to contact a corresponding physical contact terminal of an integrated circuit under test for establishing at least a first physical communication channel between the test equipment and the integrated circuit under test;

means for exchanging with the integrated circuit under test, over said first physical communication channel, at least two signals selected from the group consisting of at least two test stimuli and at least two test response signal, wherein said at least two signals are exchanged by means of at least one modulated carrier wave modulated by the at least two signals.

According to still another aspect of the present invention, an integrated circuit is provided, comprising:

at least one integrated circuit core;

at least one externally-accessible terminal, adapted to be contacted by at least a probe of a test equipment for testing the integrated circuit core, so as to establish at least a first physical communication channel between the test equipment and the integrated circuit;

means for performing a test based on test stimuli received from the test equipment; and means for exchanging with the test equipment, over said first physical communication channel, at least two signals selected from the group consisting of at least two test stimuli generated by the test equipment and at least two test response signals generated by said means for performing a test, wherein said at least two signals are exchanged by means of at least one modulated carrier wave modulated by the at least two signals.

BRIEF DESCRIPTION OF THE DRAWINGS

These and other features and advantages of the present invention will be made apparent by the following detailed description of an embodiment thereof, provided merely by way of non-limitative example, description that will be conducted making reference to the attached drawings, wherein:

FIGS. 6A and 6B partially show cross-sectional views of a probe card according to an embodiment of the present invention;

FIGS. 7A and 7B partially show cross-sectional views of a probe card according to another embodiment of the present invention;

DETAILED DESCRIPTION

Figure 1:
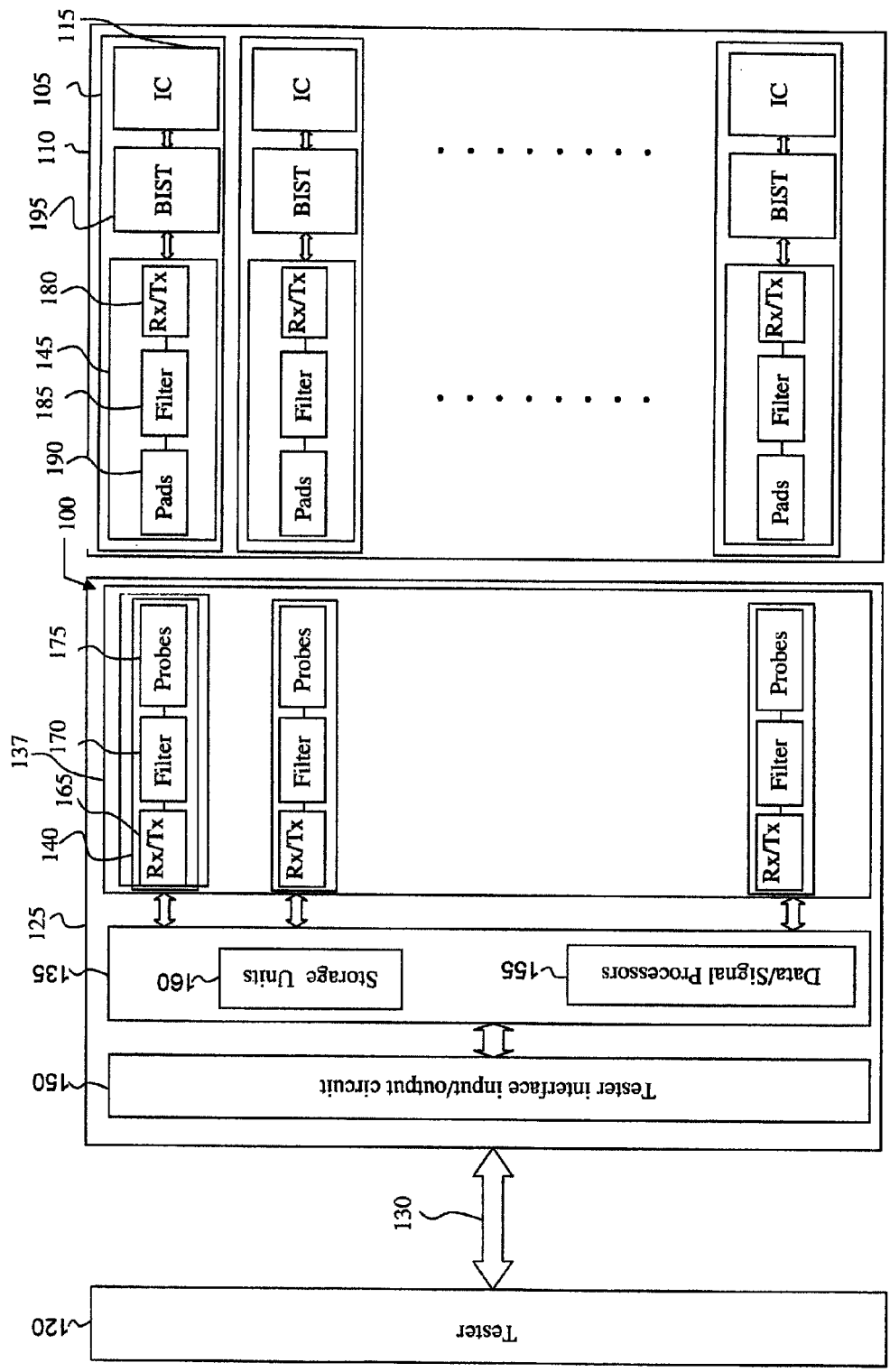
FIG. 1 schematically shows a block diagram of a test system according to an embodiment of the present invention.

Throughout the following description, identical or similar elements in the drawings are denoted by same reference numerals.

Referring to FIG. 1, a block diagram of a test system 100 according to an embodiment of the present invention is schematically shown. The test system 100 is adapted to perform the wafer-level testing of a plurality (for example, hundreds) of IC dies 105 belonging to a semiconductor wafer 110, prior to the dicing thereof into individual chips.

The specific type of IC 115 integrated on the dies 105 is not limitative to the present invention; in particular, and merely by way of example, the ICs 115 may be or include memory devices, microprocessors or microcontrollers, Digital Signal Processors (DSPs), digital logic circuits, Application Specific Integrated Circuits (ASICs), Field Programmable Gate arrays (FPGAs), analog circuits, RF circuits, MEMS (Micro Electro Mechanical Systems).

For testing the ICs 115 on the dies 105 in order to assess their functionality, the test system 100 comprises a tester 120, which is an equipment adapted to manage test signals, and in particular to generate test stimuli to be fed to the ICs 115 integrated on the dies 105, and to process test response signals received from the ICs 115 under test; the tester 120 is coupled to a probe card 125, which is adapted to communicate with the tester 120 through wire line and/or wireless electrical signal distribution means 130 (which may be or include electrical cables, conductive lines or tracks, a wireless radio link or an optical link); in particular, the probe card 125 is adapted to exchange the test signals with the tester, and receives from the tester the power supply necessary for its operation; the probe card 125 is employed for interfacing the tester 120 with the IC 115 on each die 105 on the wafer 110.

The probe card 125 comprises a control circuit 135 adapted to manage the test signals exchanged with the tester 120, and a testing section 137 comprising a plurality of communication units 140, each of which is adapted to communicate with a corresponding communication unit 145 provided in each die 105 of the wafer under test. In other words, each of the communication units 140 of the testing section 137 of the probe card 125 is adapted to establish in use a one-to-one communication relationship with a corresponding communication unit 145 provided on a corresponding one of the dies 105 of the semiconductor wafer 110 to be tested. It is pointed out that, in some embodiments of the invention, the plurality of communication units 140 of the probe card 125 may include a number of units 140 equal to the number of dies 105 of the wafer 110 to be tested (in which case, all the dies of the wafer can in principle be tested in parallel); however, in alternative invention embodiments, the number of communication units 140 of the probe card 125 may be lower than the number of dies 105 of the wafer 110 (in which case, groups of dies of the wafer are tested in parallel, and, in order to test the full wafer, the probe card can be sequentially displaced by predetermined steps with respect to the wafer under test, or a communication unit 140 can test more than one die 105), or the number of communication units 140 of the probe card may be even greater than the number of dies 105 of the specific wafer under test (in which case, only a subset of the probe card communication units 140 are used for testing the whole wafer, or one die 105 can be tested by means of more than one communication unit 140).

The tester 120 and the control circuit 135 of the probe card 125 may communicate through a tester interface input/output circuit 150. The control circuit 135 comprises for example data/signal processors 155 which control the overall operation of the probe card 125, and which operates under the control of a software/firmware stored in local storage units 160.

Each communication unit 140 includes at least one transponder/transceiver 165 (that can comprise coding/decoding circuits), which is coupled to at least one filter unit 170. A Device Under Test (DUT) interface unit 175 is provided for each communication unit 140, for the coupling with a respective die of the wafer under test; more in detail, the DUT interface unit 175 comprises a plurality of probes (for example, of MEMS type, or cantilever probes or vertical probes) which are used for establishing a physical communication channel with the corresponding communication unit 145 provided on the die 105.

Similarly, each communication unit 145 on the die 105 includes at least one transponder/transceiver 180 (that, similarly to the transponder/transceiver 165, can comprise coding/decoding circuits), which is coupled to at least one further filter unit 185 and to a probe card interface unit 190 comprising a plurality of input/output contact pads, which are used for being contacted by the probes belonging to the corresponding DUT interface unit 175. A Built In Self Testing (BIST) circuitry 195 may be provided on the die 105, adapted to coupling the communication unit 145 with the core integrated circuit 115 and to perform the testing of the IC.

The transponder/transceiver 165, with the associated filter unit 170 and the DUT interface unit 175, and the transponder/transceiver 180, with the associated filter unit 185 and probe card interface unit 190, are adapted to establish a bi-directional communication link between the probe card 125 and a corresponding die 105 of the wafer under test 110.

During the testing, the generic transponder/transceiver 165 on the probe card 125 encodes the test stimuli received from the tester 120 and transmits them to the transponder/transceiver 180 on the respective die 105 of the wafer, using any suitable coding and modulation schemes. Examples of modulation schemes include Amplitude Modulation (AM), Frequency Modulation (FM), Pulse Code Modulation (PCM), Phase Modulation (PM) or any combination thereof. The specific coding and modulation schemes are not per-se limitative of the present invention.

Then, the transponder/transceiver 180 receives, demodulates and decodes the test stimuli, provides the demodulated and decoded test stimuli to the BIST circuitry 195, and the test stimuli are then used by the BIST circuitry 195 for testing the IC 115 integrated on the die 105. Test response signals are generated by the IC 115 in response to the performed test: the test response signals are then encoded, modulated and transmitted by the transponder/transceiver 180 to the probe card 125, where the transponder/transceiver 165 performs a demodulation and decoding of the received signals, and the test response signals are then sent to the tester 120, which processes them to assess the functionality of the IC 115 integrated on the die 105 under test.

In the example at issue, as better described in the following, the power supply necessary for the operation of the ICs 115 under test is supplied thereto by means of the probes belonging to each DUT interface unit 175.

In particular, according to an embodiment of the present invention, in order to reduce the number of input/output contact pads used for testing the ICs on the dies 105 of semiconductor wafer 110, the test signals are exchanged through a reduced number of physical communication channels (each comprising the DUT interface 175 and the probe card interface 190). For this purpose, a signal mixing, based on a suitable coding and modulation scheme of the test signals, for example a frequency division multiplexing scheme, is used. As better shown in FIG. 2, the transponder/transceiver 165 for example encodes and modulates the test stimuli received from the tester 120 and transmits them with a first modulation frequency f1 (for example, ranging from 30 Hz to 300 GHZ, e.g. 30 KHz), whereas the test response signals generated by the IC 115 under test are encoded, modulated and transmitted by the transponder/transceiver 180 to the probe card 125 with a second modulation frequency f2 (for example, ranging from 30 Hz to 300 GHZ, e.g. 50 KHz) which is different from the first frequency f1. In other words, according to an embodiment of the present invention, by differentiating the radio frequencies used for transmitting the test stimuli and the test response signals, it is possible to use only one physical communication channel for the exchange of the test signals between the probe card 125 and the wafer 110.

Figure 2:
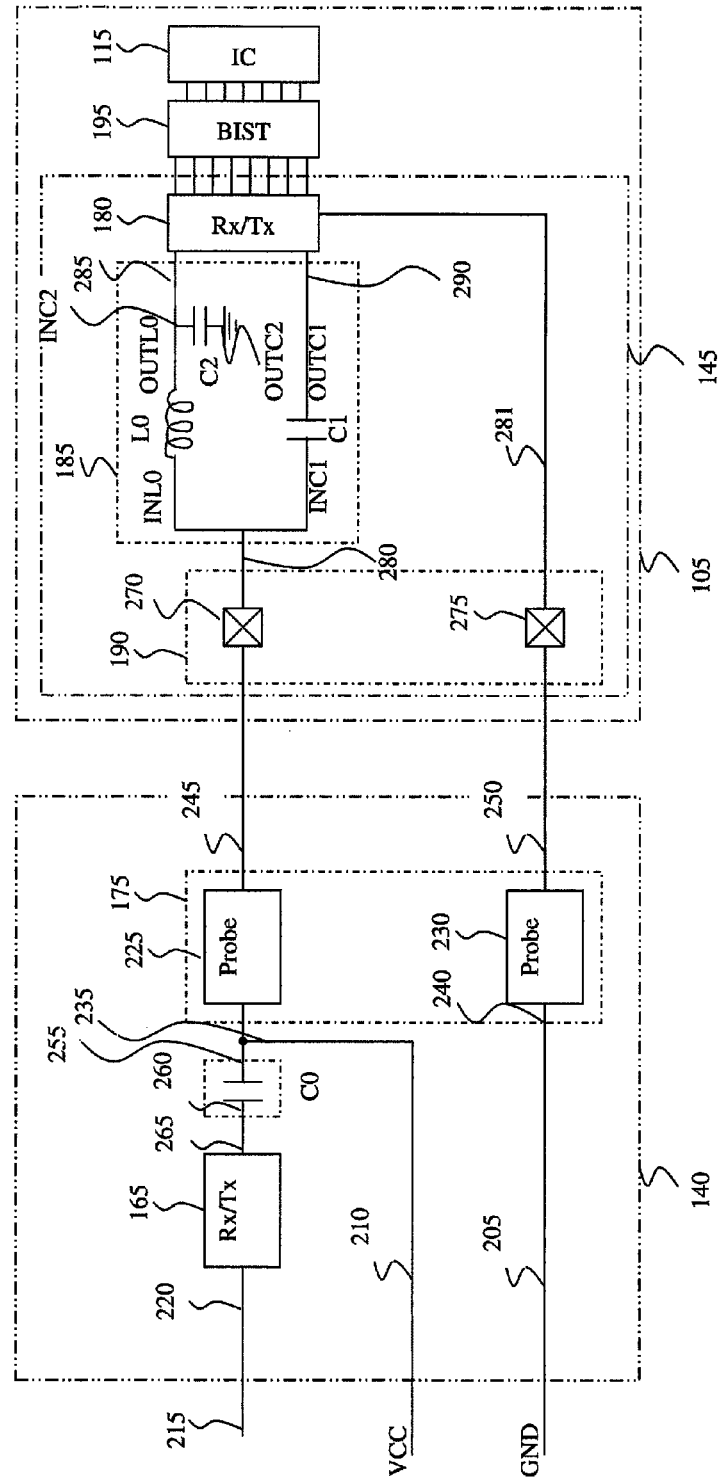
FIG. 2 schematically shows a portion of the test system of FIG. 1 according to an embodiment of the present invention.

Referring to FIG. 2, an exemplary implementation of the unit 140 and the communication unit 145 is shown.

The unit 140 receives from the tester interface input/output circuit 150 (not shown in FIG. 2) a reference voltage GND through a reference voltage distribution line 205, a supply voltage VCC through a supply voltage distribution line 210, and the test signals through a test signals distribution line 215. The test signals distribution line 215 is connected to an input terminal 220 of the transponder/transceiver 165.

The supply voltage distribution line 210 and the reference voltage distribution line 205 respectively feed the supply voltage VCC and the reference voltage GND to a first probe 225 and a second probe 230 of the DUT interface unit 175. For this purpose, the first probe 225 has a first input terminal 235, which is connected to the supply voltage distribution line 210. Similarly, the second probe 230 has a second input terminal 240, which is connected to the reference voltage distribution line 205. Moreover, the first probe 225 and the second probe 230 have respectively a first output terminal or tip 245 and a second output terminal or tip 250, which are adapted to contact the corresponding die 105 under test, and particularly the respective probe card interface unit 190 on the die 105.

In the example at issue, the filter unit 170 comprises a first capacitor C0 having a first terminal 255 connected to the first probe 225 and a second terminal 260 connected to an output terminal 265 of the transponder 165.

The probe card interface unit 190 which is provided in the communication unit 145 of the die 105 includes a first input/output contact pad 270 and a second input/output contact pad 275 which are adapted to be contacted during the test of the die 105 by the tips 245 and 250 of the first probe 225 and the second probe 230, respectively. The input/output contact pad 270 is connected to an input terminal 280 of the filter unit 185, whereas the contact pad 275 is connected to an input terminal 281 of the transponder/transceiver 180 (so that the pad 275 provides the reference voltage GND to the transponder 180).

In the example at issue, the filter unit 185 comprises a second and a third capacitors C1 and C2 and an inductor L0. More in detail, the inductor L0 has a first terminal INL0, which is connected to the filter unit input terminal 280, and a second terminal OUTL0, which is connected to a first terminal INC2 of the capacitor C2. A second terminal OUTC2 of the capacitor C2 is kept to the reference voltage GND. Moreover, the first terminal INC2 of the capacitor C2 is connected to a first output terminal 285 of the filter unit 185.

In turn, the capacitor C1 has a first terminal INC1, which is connected to the input terminal 280, and a second terminal OUTC1, which is connected to a second output terminal 290 of the filter unit 185. The first output terminal 285 and the second output terminal 290 are connected to the transponder/transceiver 180.

During the testing, the reference voltage GND and the supply voltage VCC (which are essentially constant, time-invariable voltages, or vary at very low frequencies) are fed to the communication unit 145. In particular, the second probe 230, by directly contacting the input/output contact pad 275, provides the reference voltage GND to the transponder/transceiver 180. Similarly, the supply voltage VCC is fed to the communication unit 145 by means of the first probe 225, which is adapted to directly contact the input/output contact pad 270. The supply voltage VCC does not affect the voltage reached by the output terminal 265, since the first capacitor C0 has a high impedance (ideally, it is an open circuit) at low frequencies. Through the probe 225 and the contact pad 270, the IC on the die under test 105 receives a signal being the superposition of an essentially DC (Direct Current) signal, corresponding to the supply voltage VCC, and of the test stimuli, encoded and modulated at the first frequency f1. This combined signal is fed to the filter 185, which separates the DC component from the signal component at the first frequency f1. The DC component, corresponding to the supply voltage VCC, is made available at the first output terminal 285 of the filter 185, and is fed to the transponder/transceiver 180, since the inductor L0 has a low impedance (ideally, it behaves as a short circuit in DC). The second capacitor C2 does not affect the voltage reached by the first output terminal 285 since it has a high impedance (ideally, it behaves as an open circuit in DC). In DC, also the capacitor C1 has a high impedance (ideally, it behaves as an open circuit), thus the DC signal component does not reach the second output terminal 290 of the filter 185.

The signal component at the first radio frequency f1 is made available at the second output terminal 290 of the filter 185, and is sent to the transponder/transceiver 180, since the capacitor C1, at the first frequency f1, has a low impedance (ideally, it behaves as a short circuit). The signal component at the first frequency f1 does not reach the first output terminal 285 of the filter 185, since at the first frequency f1 the capacitor C2 has a low impedance (ideally, it behaves as a short circuit), and the inductor L0 has a high impendence (ideally, it behaves as an open circuit); thus, the signal carrying the test stimuli do not affect the voltage at the first output terminal 285 of the filter unit 185. In this way, the essentially DC component (carrying the voltage supply) and the component at the first frequency f1 (carrying the test stimuli) of the combined signal transmitted to the die 105 through the probe 245 are effectively separated by the filter 185

The transponder/transceiver 180 receives, demodulates and decodes the test stimuli, and the test stimuli are then supplied to the BIST circuitry 195 for testing the IC 115 integrated on the die 105; test response signals are generated in response to the test performed by the IC 115 based on the received test stimuli: the test response signals are encoded, modulated and transmitted with the second radio frequency f2 by the transponder/transceiver 180 to the probe card 125 over the same communication channel formed by the contact pad 270 and the probe 225. The transponder/transceiver 165 performs a demodulation and decoding of the received, modulated and coded test response signals, and the demodulated and decoded test response signals are then sent (in a way similar to that described above) to the tester 120, which processes them to assess the functionality of the IC 115 integrated on the die 105 under test.

In this way, in the exemplary invention embodiment being described, only two input/output contact pads need to be contacted by probes for testing the IC on the die 105, since the test stimuli and the test response signals are exchanged with different operative radio frequencies exploiting a same physical communication channel, i.e. a same probe.

Figure 3:
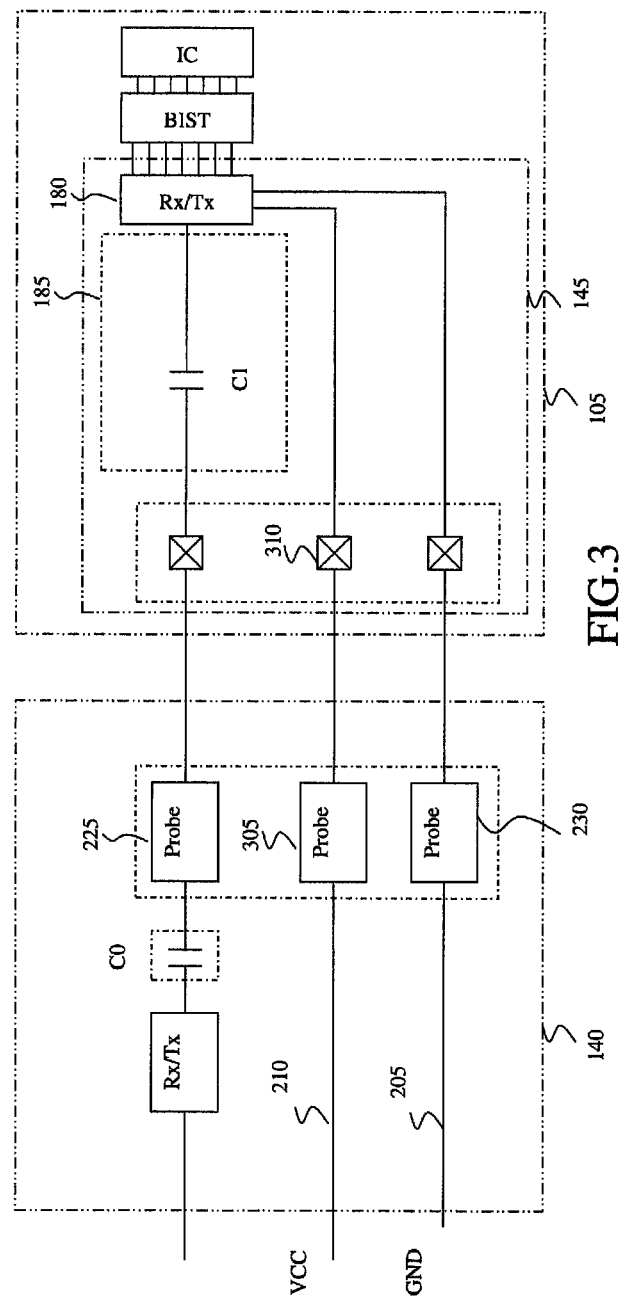
FIG. 3 schematically shows a portion of the test system of FIG. 1 according to another embodiment of the present invention.

In FIG. 3 an exemplary implementation of the unit 140 and the communication unit 145 according to another embodiment of the present invention is shown. In this case, three physical communication channels, comprising three probes and corresponding contact pads on the die under test are used for communicating with the generic IC 115 under test. The supply voltage distribution line 210 on the probe card is coupled to a third probe 305 (an additional probe compared to the two probes 225 and 230 of the previous embodiment) which is adapted for contacting a corresponding input/output contact pad 310 of the probe card interface unit 190. In this case, the supply voltage VCC reaches directly the transponder/transceiver 180. The filter unit 185 does not have to perform a separation of signal components at DC and at the first frequency, thus it can be simplified. In particular, the filter unit 185 may eventually comprise only the capacitor C1 (C2 can be omitted); alternatively, both the capacitors C0 and C1 may be omitted. However, the presence of optimized filters 170, 185 becomes particularly useful when the frequencies used for modulating the test signals are so high that the physical communication channels need to be characterized by means of a distributed-parameters electrical model.

Figure 4:
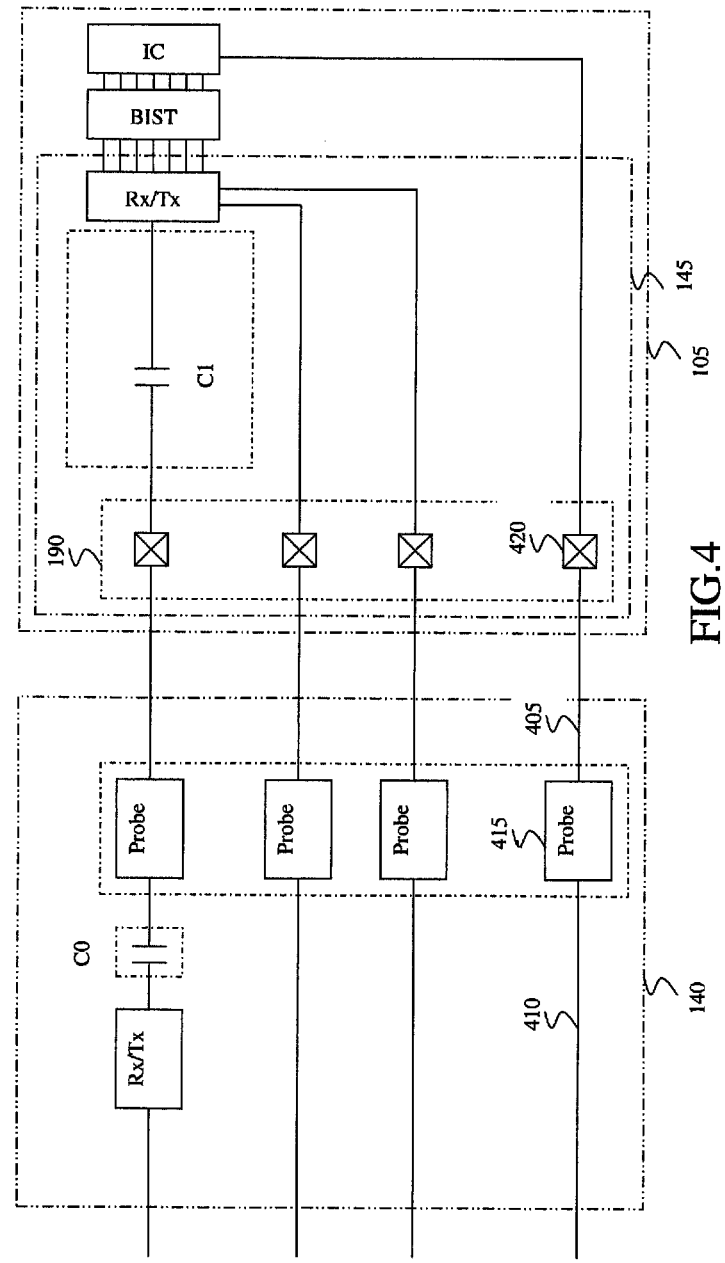
FIG. 4 schematically shows a portion of the test system of FIG. 1 according to still another embodiment of the present invention.

In FIG. 4, an exemplary implementation of the unit 140 and the communication unit 145 according to still another embodiment of the present invention is shown. In this case, compared to the embodiment of FIG. 3, a still additional physical communication channel 405 is provided, comprising a distribution line 410 on the probe card, which is connected to a fourth probe 415. The probe 415 is adapted to contact a corresponding input/output contact pad 420 of the probe card interface unit 190. Through the additional channel 405, additional test signals can be exchanged; for example, the additional channel 405 may be exploited for testing the integrated circuit 105 without the use of the BIST circuit 195. For example, the additional channel can be employed for testing power circuits or RF circuits or analog circuits or for Automatic Tester Equipment (ATE) essential resources use in order to measure particular parameters or characteristics.

In the following, exemplary embodiments of the probe card are presented, adapted to be used in the context of the present invention.

Figure 5A:
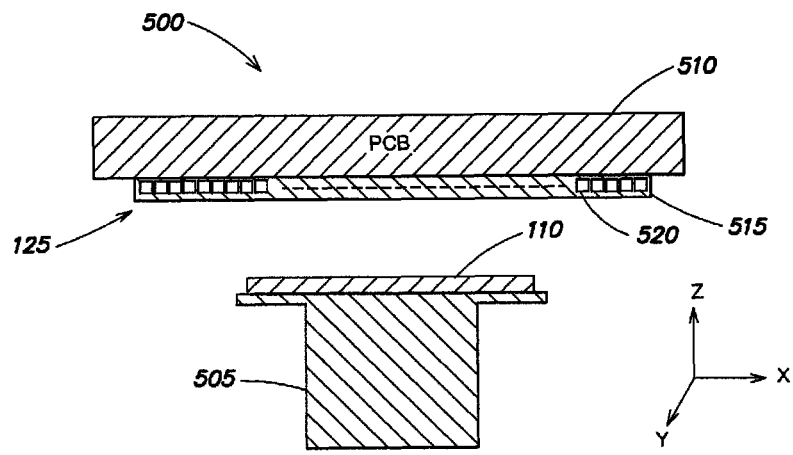
FIGS. 5A and 5B schematically show cross-sectional views of a probe card according to an embodiment of the present invention, adapted to be used in the test system of FIG. 1.
Figure 5B:
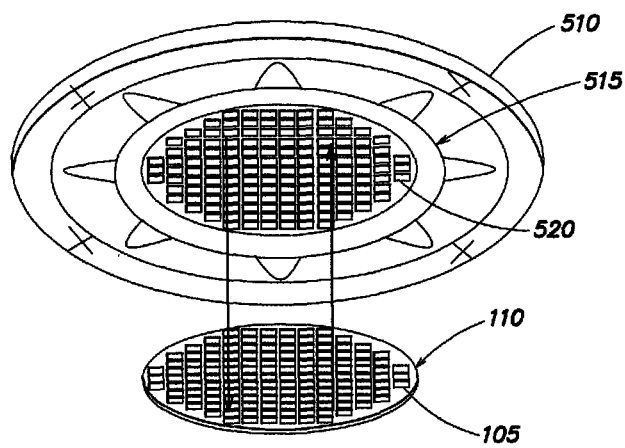

Referring to FIGS. 5A and 5B, a cross-sectional view of a test equipment 500 is schematically shown, in which an exemplary structure and the positioning of the probe card 125 according to an embodiment of the present invention and the semiconductor wafer 110 to be tested is visible.

The semiconductor wafer 110 to be tested is placed on a chuck 505, which is capable of movement in the three orthogonal directions "x", "y" and "z" schematically indicated in the drawing. The chuck 505 may also be rotated and tilted, and it may be further capable of other movements, so that once the semiconductor wafer 110 is placed on the chuck 505, the latter is moved in order to bring the dies 105 of the wafer 110 to be tested close to the probe card 125, for enabling the communication therewith.

In the example at issue, the probe card 125, in one of its embodiments, includes a PCB 510 forming a support for a pseudo wafer 515, comprising a plurality of dies, each one forming an elementary probe unit 520.

The PCB 510 comprises all the circuitry, which is employed for the communication between the tester (not shown in figures) and the semiconductor wafer 110 under test. For example, the PCB 510 comprises the tester interface input/output unit 150, the data/signal processors 155, and the storage units 160.

A top view of the probe card 125 (including the pseudo wafer 515) and the semiconductor wafer 110 is also schematically shown in the drawing.

As visible, the elementary units 520 are arranged in the pseudo silicon wafer 515 in order to form a two-dimensional arrangement, which corresponds, to the arrangement of dies on the semiconductor wafer 110 under test. In particular, the pseudo wafer 515 comprises an array of the elementary units 520 which reproduce a shape of the wafer to be tested. In an embodiment of the present invention, each of the elementary unit 520 of the pseudo 515 belonging to the probe card 125 is adapted to establish a one-to-one communication relationship with a corresponding die of the semiconductor wafer 110 to be tested, a number of MEMS probes adapted to contact the pads of an IC. It is to be appreciated that probes of different type or arranged with a different architecture can be used (e.g. vertical probes, or pogo pins).

In particular, as better described in the following, each elementary unit 520 may be formed starting from a silicon die, individually diced and finally assembled with the other elementary units 520 in order to form the pseudo wafer 515 having a shape corresponding to the semiconductor wafer 110 to be tested.

Referring to FIGS. 6A and 6B, a portion of the probe card 125 according to an embodiment of the present invention is shown. In particular, FIGS. 6A and 6B show an elementary unit 520 according to an embodiment of the present invention. The elementary unit 520 includes a silicon die 605 which is connected, e.g. by chip on board/flip-chip techniques, to the PCB 510. In particular, bumps 610 are provided in order to connect a top surface 615 of the silicon die 605 to the PCB 510. A complex conductive path (not completely shown in the figures) that can include one or more conductive through vias 620, particularly Through Silicon Vias (TSVs), is provided crossing the silicon die 605 in order to connect the top surface 615 to a bottom surface 625 of the silicon die 605. Mechanical elements forming probes 630 (one of which is shown in FIG. 6B), particularly of MEMS type, are connected to the bottom surface 625 of the silicon die 605. In particular, the through vias 620 are adapted to electrically connect the MEMS probes 630 to the top surface 615 of the silicon die 605 and thus to the PCB 510, through a conductive path (only partially shown in the drawing).

The transponders/transceivers 165 are integrated in the silicon die 605.

In particular, for electrically contacting the input/output contact pads of the die to be tested and exchanging the test signals between the input/output contact pads and the tester (not shown in figure), the PCB 510 has corresponding conductive paths 635 which electrically couple the tester to the silicon die 605 and thus to the probes 630. In particular, for testing the ICs of the wafer dies in order to assess their functionality, the tester is adapted to generate test stimuli to be fed to the ICs integrated on the dies belonging to the semiconductor wafer 110; the tester is coupled by means of the PCB 510 to the elementary units 520, each one of which is adapted to be fed by the tester through the conductive paths 635 with the test stimuli, and the power supply necessary for its operation.

In other words, the MEMS probes 630, the through vias 620, the bumps 610 and the conductive paths 635, are adapted to establish a bi-directional link between the tester and each die of the semiconductor wafer 110 under test (or groups of dies).

In an embodiment of the present invention, the probe card 125 receives the test stimuli from the tester, encodes, modulates and transmits them with the first radio frequency f1 to the ICs on the dies to be tested using the MEMS probes 630. The test stimuli, after having been demodulated and decoded, are then used to test the IC integrated on the die belonging to the semiconductor wafer 110; test response signals are generated by the ICs in response to the test stimuli. The test response signals are encoded, modulated and transmitted at the second radio frequency f2 to the probe card 125, and then, after having been demodulated and decoded, they are sent to the tester, which processes them to assess the functionality of the IC integrated on the die under test.

Referring to FIGS. 7A and 7B, an elementary unit 520 according to another embodiment of the present invention is shown. Similarly to the preceding case, each elementary unit 520 comprises the silicon die 605, bumps 610, through vias 620 and the MEMS probe 630. In this case the transponder/transceiver 165 is integrated in an auxiliary die 710 which is connected, e.g. by chip on board/flip-chip techniques, to the PCB 510. In particular, bumps 715 are provided in order to connect a bottom surface 720 of the auxiliary die 710 to the PCB 510 and/or for the connection to the tester.

Moreover, for electrically contacting the input/output contact pads of the die to be tested and exchanging the test signals between the input/output contact pads and the tester (not shown in figures), the PCB 510 has corresponding conductive paths 725 which electrically couple the bumps 610 to the bumps 715 so as to couple the tester to the silicon die 605 and thus to the probes 630.

Further conductive paths 730 are provided for electrically coupling the transponder 165 to the circuits belonging to the PCB 510.

Figure 8A:
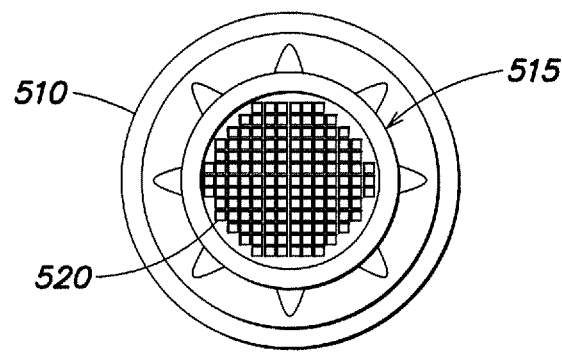
FIGS. 8A and 8B partially show cross-sectional views of a probe card according to still another embodiment of the present invention.
Figure 8B:
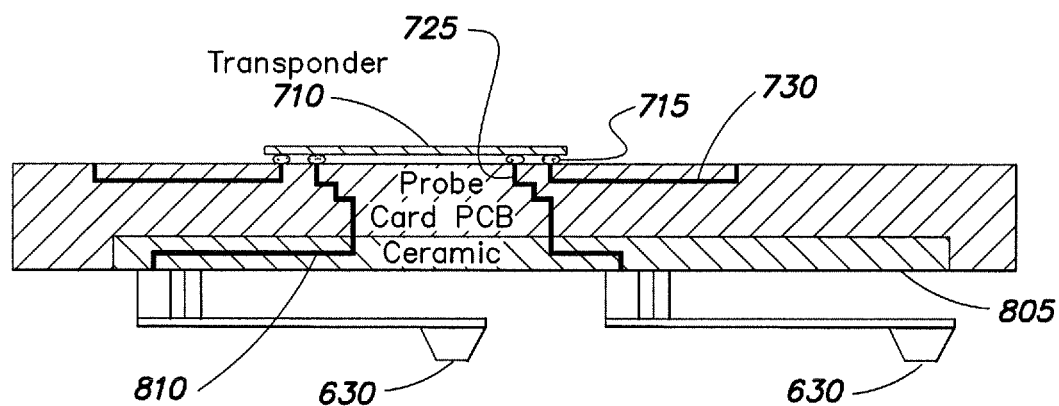

Referring to FIGS. 8A and 8B, an elementary unit 520 according to still another embodiment of the present invention is shown.

With respect to the preceding embodiment, the silicon die 605 is substituted by a ceramic layer 805 to which the probes 630 are connected. In particular, the ceramic layer 805 is employed for forming a support for the probes 630. Conductive paths 810 are provided within the ceramic layer 805 for electrically coupling each probe 630 to the corresponding conductive path 725.

The present invention allows testing the ICs integrated on the dies of the semiconductor wafer 110 by using a reduced, possibly very low number of contact pads and probes, thereby improving the performance and the reliability of the testing, and reducing the costs of the test equipment.

Although in the preceding description reference has been made to a test system wherein each communication unit 145 in the dies to be tested includes only one transponder/transceiver, two or more transponders/transceivers can be provided in each communication unit 145. In such a way, according to an embodiment of the present invention, each transponder/transceiver may be used not only for performing the testing, but also for other applications. For example, the transponders/transceiver integrated in each communication unit may be used for chip-to-chip communication in multichip systems (such as Systems In Package—SIPs), or, in case the dies integrate Systems-on-Chip, made up of several different functional units (e.g., CPU, memory, input/output buffers), for the communication between the different units within the IC. In particular, the communication unit 145 provided in each die 110 may be exploited, when the dies containing different ICs are packaged in a single package to form a SIP, for the communication between the different ICs of the SIP, thereby reducing the number of signal lines necessary for their interconnection. Similarly, in the case of a SoC, the communication between the different functional units thereof may take advantage of the presence of the communication unit 145, thereby the number of signal lines to be formed on the IC may be greatly reduced.

According to an embodiment of the present invention, multiple test stimuli can be mixed and sent by the probe card to the generic IC under test over a same communication channel, i.e. through one probe, by exploiting different frequencies. For example, considering the case of ICs formed of or including semiconductor memories, commands, address signals and input data can be sent to the memory IC through a same probe Conventionally, address signals are supplied to the IC using several probes, contacting the multiplicity of address contact pads of the memory, and input data are supplied to the IC using several other probes, contacting the multiplicity of data contact pads of the memory.

According to a further embodiment of the present invention, using a same probe and contacting one pad only on the IC, the commands can be sent coding and modulating them over a signal carrier at one frequency, the address signals can be sent coding and modulating them over a signal carrier at another frequency, and the input data can be sent coding and modulating them over a signal carrier at still another frequency. Properly designed filter units in the probe card and in the ICs may be used to separate the different signal components.

According to a still further embodiment of the present invention, a first communication channel, i.e. one probe, can be used for communications from the probe card to the IC under test, to send to the IC under test multiple test stimuli, and a second communication channel, i.e. another probe, can be used for communications from the IC under test back to the probe card, to send the multiple test response signals (for example, the output data of a memory device, generally comprised of eight or sixteen bits, may be coded and modulated and sent through one probe only). Multiple test stimuli can be mixed and sent over the first communication channel, and, similarly, multiple test response signals can be mixed and sent over the second communication channel, for example adopting a frequency-division multiplexing scheme; the different frequencies used in the second communication channel for sending the test response signals may be the same as those used in the first communication channel for sending the test stimuli, since the two channels are separated.

The concepts of the present invention can be advantageously applied to even more complex IC structures, as in a three dimensional (3D) IC structure. As it is well known to those skilled in the art, a 3D IC structure is formed by a plurality of vertically stacked device layers, each one including at least one respective semiconductor chip. The semiconductor chip of a generic device layer may be physically linked to the semiconductor chips of the adjacent device layers in the stack by means of a wafer bonding process; alternatively, starting from a bottom semiconductor substrate, the semiconductor chips of the various device layers may be formed by means of an epitaxial growth process. With a 3D IC structure it is possible to integrate a relatively complex system without having to waste an excessive silicon area. For example, the bottom device layer of a 3D IC structure may be directed to the integration of processing and logic circuits, an intermediate device layer may be directed to the integration of memory circuits, and the top device layer may be directed to the integration of input/output circuits and converters. A generic device layer is able to exchange signals and reference and supply voltages with the adjacent device layers in the stack by means of respective through vias, and particularly TSVs, vertically crossing the semiconductor chip of the device layer from the top surface to the bottom surface thereof. With an arrangement of such type, a 3D IC structure is able to receive and provide signals and reference and supply voltages from/to the outside through input/output circuits and contact pads which are integrated for example on the top surface of the top device layer only. Indeed, the lower device layers cannot be directly accessed, lacking of free surfaces provided with contact pads that can be reached from the outside. This drawback negatively affects the test operations to be performed on a 3D IC structure, since a probe card cannot directly interface the tester with the integrated circuits corresponding to the lower device layers. The only way the test signals provided by the probe card are able to reach the integrated circuits of a generic lower device level is through physical communication channels that cross the semiconductor chips of the higher device levels. As a consequence, since all the test signals needed for assessing the functionality of the whole 3D IC structure have to pass through the top device level, the number of probes of the probe card that have to be coupled to contact pads on the top surface of said device level during the test operations becomes really high. For the reasons already described, a probe card requiring a too high number of probes is not efficient, and is very expensive.

According to an embodiment of the present invention, the proposed solution of reducing the number of probes necessary to perform the test operations by employing a mixing of multiple test stimuli and/or test response signals over a same physical communication channel can be advantageously exploited for overcoming the abovementioned problems.

Figure 9A:
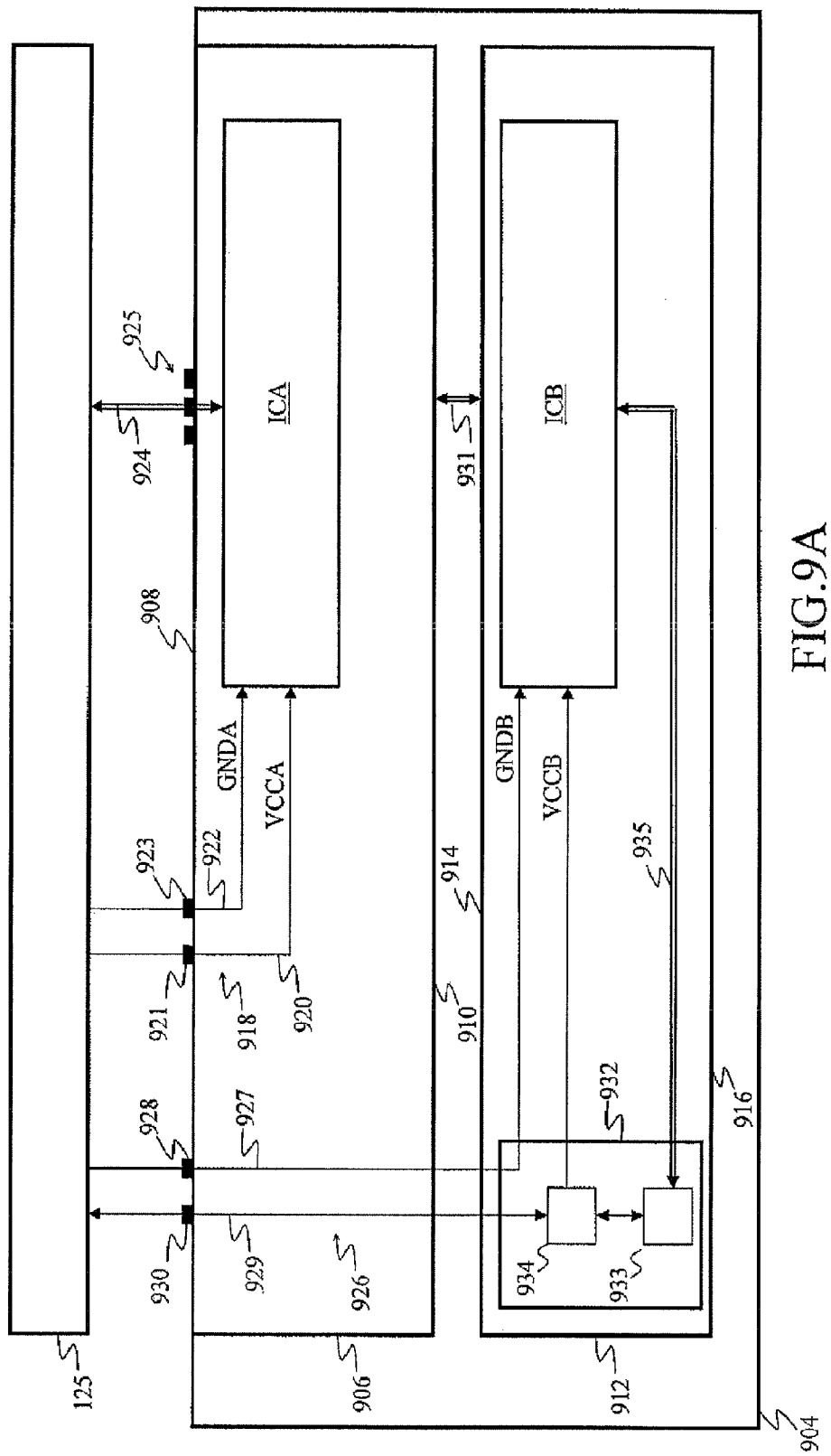
FIGS. 9A-9D schematically show in terms of very simplified functional blocks a 3D IC structure according to various embodiments of the present invention.

Referring to FIG. 9A, an exemplary 3D IC structure 904 according to an embodiment of the present invention is shown in terms of very simplified functional blocks. For the sake of simplicity, the exemplary 3D IC structure 904 is partitioned in two device levels only—referred to as top device level and bottom device level—, but the concepts of the present invention can be applied to any number of device levels.

The top device level includes a semiconductor chip 906 having a top main surface 908 and a bottom main surface 910; the semiconductor chip 906 integrates a first integrated circuit, globally identified with the reference ICA. Similarly, the bottom device level includes a semiconductor chip 912 having a top main surface 914 and a bottom main surface 916; the semiconductor chip 912 integrates a second integrated circuit, identified with the reference ICB.

The semiconductor chips 906 and 912 forming the 3D IC structure 904 are arranged in a vertical stack, with the bottom main surface 910 of the semiconductor chip 906 that overtops the top main surface 914 of the semiconductor chip 912.

For allowing the integrated circuit ICA to be electrically supplied from the outside of the 3D IC structure 904 during its operation, the semiconductor chip 906 is provided with a dedicated first supply bus 918. More in detail, the first supply bus 918 includes a supply voltage line 920 coupling the integrated circuit ICA with a respective contact pad 921 on the top main surface 908; the first supply bus 918 further includes a reference voltage line 922 coupling the integrated circuit ICA with another respective contact pad 923 on the top main surface 908. In this way, the integrated circuit ICA can be fed from the outside of the 3D IC structure 904 with a supply voltage VCCA (through the contact pad 921 and the supply voltage line 920) and a reference voltage GNDA (through the contact pad 923 and the reference voltage line 922).

Similarly, in order to exchange input/output signals (such as command, data and address signals) with the outside of the 3D IC structure 904, a first operative bus 924 couples the integrated circuit ICA with a set of respective contact pads on the top main surface 908, globally indicated in the figure with the reference 925.

For electrically supplying the integrated circuit ICB, a second supply bus 926 is provided, which vertically crosses the semiconductor chip 906 from the top surface 908 to the bottom surface 910 thereof (e.g., by means of respective TSVs) for reaching the top surface 914 of the semiconductor chip 912, and then the integrated circuit ICB.

More in detail, the second supply bus 926 includes a reference voltage line 927 coupling the integrated circuit ICB with a respective contact pad 928 on the top main surface 908 of the semiconductor chip 906; the second supply bus 926 further includes a supply voltage line 929 coupling the integrated circuit ICB with a further respective contact pad 930 on the top main surface 908 of the semiconductor chip 906. The integrated circuit ICB can be fed from the outside of the 3D IC structure 904 with a reference voltage GNDB (through the contact pad 928 and the reference voltage line 927) and a supply voltage VCCB (through the contact pad 930 and the supply voltage line 929).

In order to exchange command, data and address signals with the outside of the 3D IC structure 904, the integrated circuit ICB is coupled with the semiconductor chip 906 through a second operative bus 931. By means of respective TSVs, the second operative bus 931 reaches the integrated circuit ICA, in such a way that the signals carried by said operative bus 931 may be provided/received to/from the outside of the 3D IC structure 904 exploiting the first operative bus 924 and the respective contact pads 925 on the top main surface 908. In addition or in alternative, the second operative bus 931 may be also directly connected with the first operative bus 924.

In order to test its functionality, the 3D IC structure 904 is positioned close to the probe card 125, for bringing the contact pads located on the top surface 908 of the semiconductor chip 906 in contact with the probes of the probe card 125, in such a way to enable the communication between the tester 120 and the integrated circuit ICA of the semiconductor chip 906. Particularly, during the test operations, the integrated circuit ICA is supplied by means of probes of the probe card 125, which physically contact the contact pads 921 and 923 for providing the supply voltage VCCA and the reference voltage GNDA. Moreover, the test signals generated during the test operations are exchanged between the tester 120 and the integrated circuit ICA by means of further probes of the probe card 125, which physically contact the contact pads 925.

Similarly, during the test operations, the integrated circuit ICB is supplied by means of probes of the probe card 125 that physically contact the contact pads 928 and 930 for providing the supply voltage VCCB and the reference voltage GNDB.

During the testing, according to an embodiment of the present invention, the test stimuli generated by the tester 120 to be provided to the integrated circuit ICB and the test response signals generated by the latter circuit in response to the received test stimuli are exchanged between the probe card 125 and the integrated circuit ICB by means of the second supply bus 926, and particularly by encoding and transmitting them over at least one among the lines forming the second supply bus 926.

For this purpose, the semiconductor chip 912 is provided with a communication unit 932 of the same type of the communication unit 145 previously described. The communication unit 932 comprises at least one transponder/transceiver 933 (comprising coding/decoding circuits) coupled with at least one filter unit 934. Particularly, according to an embodiment of the present invention, the filter unit 934 has an input connected to the supply voltage line 929, a first output connected to the integrated circuit ICB, and a second output connected to an input of the transponder/transceiver 933. The transponder/transceiver 933 has an output coupled with the integrated circuit ICB by means of a third operative bus 935.

In the same way as for the previous embodiments, the probe card 125 encodes the test stimuli generated by the tester 120 and transmits them to the communication unit 932 by means of any suitable coding and modulation scheme using a first modulation frequency fm1 (for example, ranging from 30 Hz to 300 GHZ). Particularly, the probe card 125 superimposes the encoded and modulated test stimuli to the supply voltage VCCB (which is essentially constant) over the supply voltage line 929, providing it to the alter unit 934. The filter unit 934 separates the DC component—which corresponds to the supply voltage VCCB—from the signal component at the first modulation frequency fm1—which corresponds to the encoded and modulated test stimuli. While the DC component is directly provided to the integrated circuit ICB for the electric supply thereof, the signal component corresponding to the encoded and modulated test stimuli is demodulated and decoded by the transponder/ transceiver 933, which accordingly retrieves the test stimuli generated by the tester 120 and provides it to the integrated circuit ICB by means of the third operative bus 935. The test response signals generated by the integrated circuit ICB in response to the performed test are then encoded, modulated and transmitted by the transponder/transceiver 933 to the probe card 125 over the supply voltage line 929, using a second modulation frequency fm2 different from the first modulation frequency.

In the same way as for the previous embodiments, a BIST circuitry may be provided in the semiconductor chip 912, adapted to couple the communication unit 932 with the integrated circuit ICB and to perform the testing thereof (similar considerations apply to the testing of the integrated circuit ICA).

Thus, with embodiments of the present invention, it is possible to drastically lower the number of probes necessary to perform the testing of the integrated circuits of a 3D IC structure, overcoming all the abovementioned drawbacks.

Figure 9B:
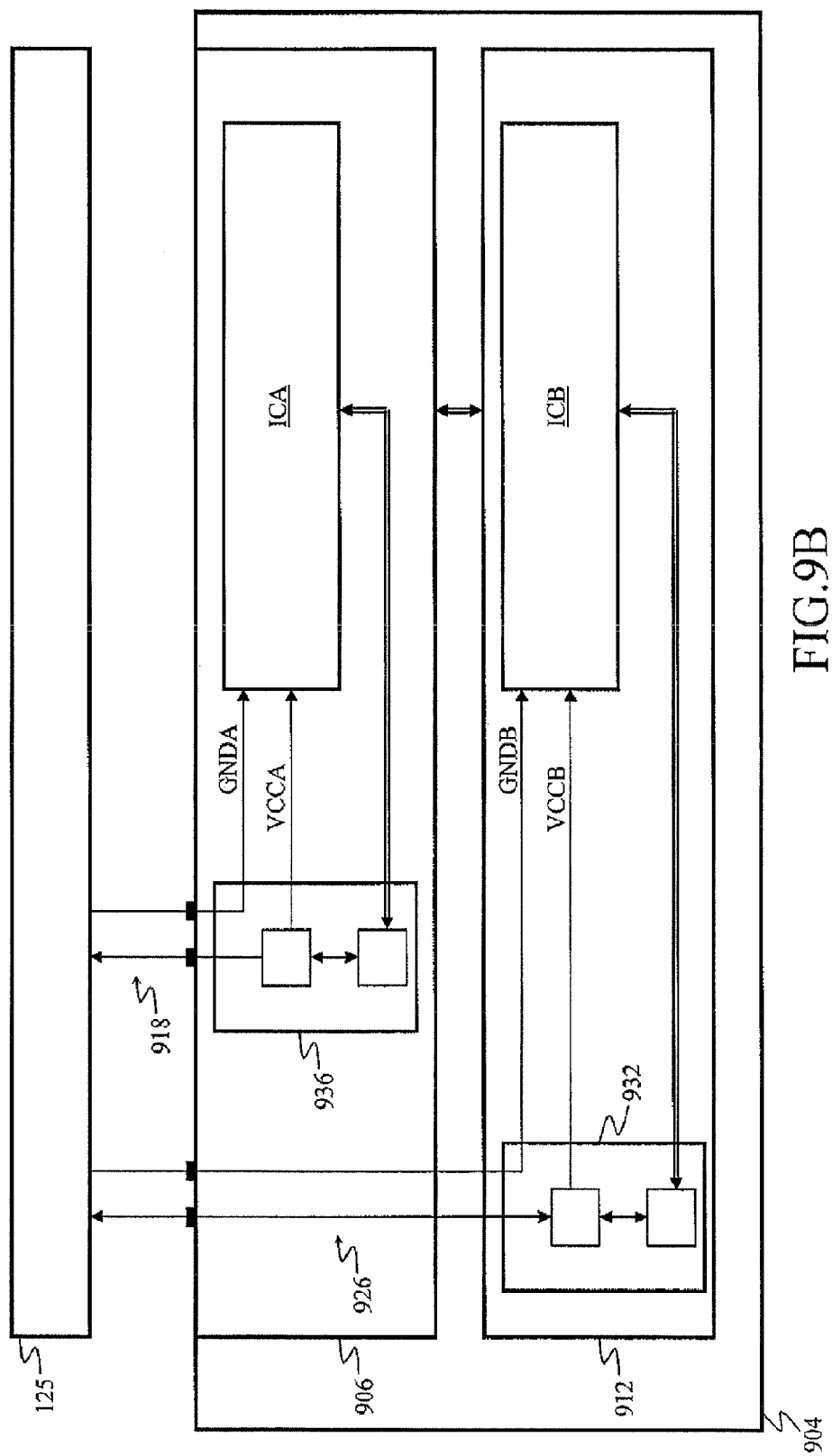

According to a further embodiment of the present invention illustrated in FIG. 9B, also the semiconductor chip 906 is provided with a communication unit 936 coupled with the supply bus 918 in the same way as the communication unit 932. As a consequence, the probe card 125 may send test stimuli to the integrated circuit ICA and receive test response signal therefrom without having to physically access with the probes dedicated contact pads on the top surface of the semiconductor chip 906. In this way, the number of probes required for performing the test operations are further reduced.

Figure 9C:
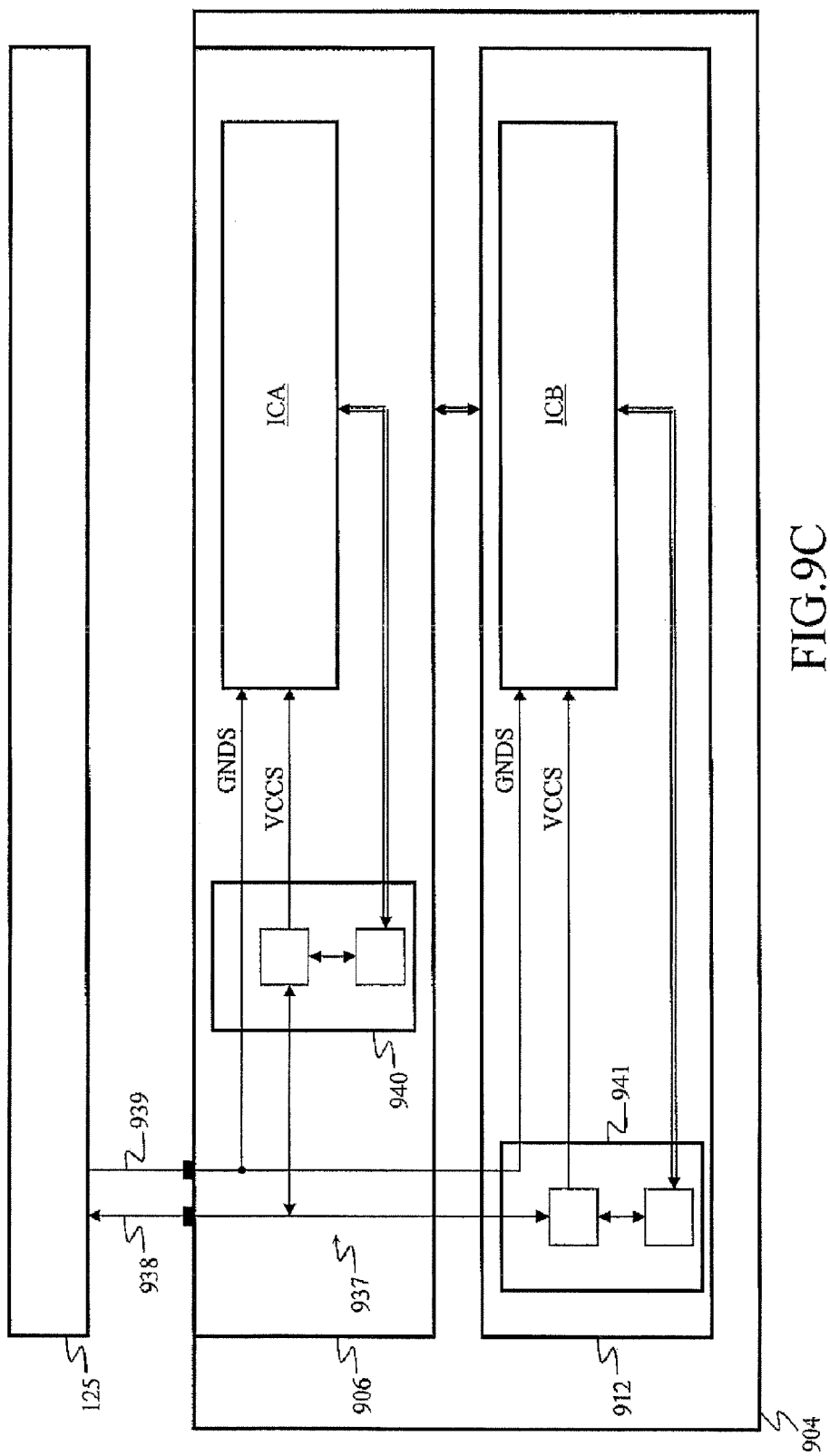

According to a still further embodiment of the present invention illustrated in FIG. 9C, the integrated circuits ICA and ICB of the 3D IC structure 904 share a same supply bus 937. The supply bus 937 comprises a supply voltage line 938 adapted to provide a same supply voltage VCCS and a reference voltage line 939 adapted to provide a same reference voltage GNDS to both the integrated circuits ICA and ICB.

According to this embodiment of the present invention, the test stimuli generated by the tester 120 to be provided to the integrated circuits ICA, ICB and the test response signals generated by the latter circuits in response to the received test stimuli are exchanged between the probe card 125 and the integrated circuits by means of the supply bus 937, and particularly by encoding and transmitting them over at least one among the lines forming the supply bus 937. Particularly, the test stimuli directed to the integrated circuit ICA are transmitted over the supply voltage line 938 using a first modulation frequency, while the test stimuli directed to the integrated circuit ICB are transmitted over the same supply voltage line 938 using a second modulation frequency different from the first one. In this case, both the semiconductor chips 906 and 912 are provided with a respective communication unit 940, 941 coupled with the supply voltage line 938. Particularly, the communication unit 940 integrated in the semiconductor chip 906 is adapted to collect the signal component at the first modulation frequency from the supply voltage line 938, and perform demodulating and decoding operations for retrieving the test stimuli for the integrated circuit ICA. Moreover, the communication unit 941 integrated in the semiconductor chip 912 is adapted to collect the signal component at the second modulation frequency from the supply voltage line 938, and perform demodulating and decoding operations for retrieving the test stimuli for the integrated circuit ICB.

The concepts of the present invention can be applied to further 3D IC structure configurations, different from that illustrated in the FIGS. 9A-9C.

For example, the integrated circuits ICA and ICB may share a same reference voltage line adapted to convey a reference voltage to be used by both the integrated circuits, but each integrated circuit ICA, ICB may be coupled with a respective supply voltage line adapted to convey a dedicated supply voltage. In this case, by providing each semiconductor chip 906, 912 with a communication unit comprising a transponder/transceiver and a filter coupled with the respective supply voltage line, test stimuli and test response signals for both the integrated circuits can be encoded and modulated for being advantageously transmitted over the supply voltage lines.

Moreover, even in case the 3D IC structure comprises a higher number of vertically stacked semiconductor chips sharing a same internal supply bus, each semiconductor chip may be advantageously provided with a respective communication unit coupled with the internal supply bus. In this way, the test stimuli and the test response signals may be encoded and modulated for being transmitted over the internal supply voltage, in such a way to allow the number reduction of probes necessary to perform the testing on the semiconductor chips forming the stack.

If the semiconductor chip 906 of the top device level has a size smaller than the size of the semiconductor chip 912 belonging to the adjacent (lower) device level, portions of the top surface 914 of the semiconductor chip 912 may result not to be covered by the semiconductor chip 906. In this way, the semiconductor chip 912 may be provided with contact pads on said uncovered portions of its top surface 914, which can be directly accessed by probes of the probe card 125 during the testing. However, even in this case, the number of probes of the probe card 125 necessary for performing the testing may be reduced by implementing a communication unit coupled with the supply bus in at least one among the semiconductor chips 906 and 912, in the same ways as previously described.

Figure 9D:
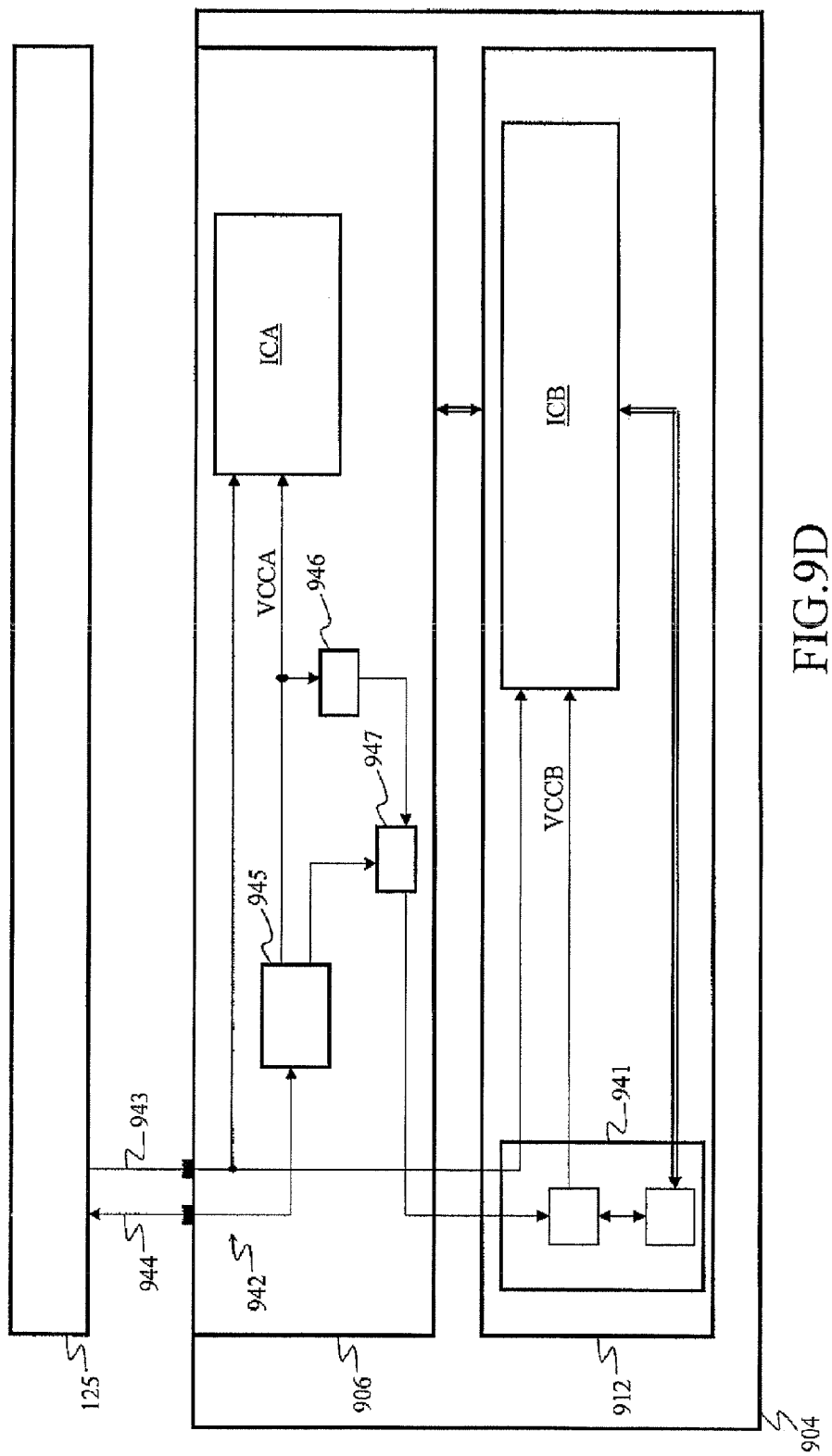

A quite different scenario of application of the concepts of the present invention is illustrated in FIG. 9D. Particularly, in the scenario illustrated in FIG. 9D, the supply voltages VCCA, VCCB required for operating the integrated circuits ICA and ICB of the 3D IC structure 904 have different values, but the 3D IC structure 904 is provided with a single supply bus 942 only, and particularly including a single reference voltage line 943 and a single supply voltage line 944. In the same way as previously described, the supply voltage VCCA (which is substantially constant) superimposed with encoded and modulated (at a predetermined modulation frequency) test signals generated by the probe card 125 are conveyed over the supply voltage line 944.

The semiconductor chip 906 includes a filter circuit 945 connected to the supply voltage line 944 for receiving the supply voltage VCCA mixed with the encoded and modulated test signals. The filter circuit 945 separates the constant component (corresponding to the supply voltage VCCA) from the component oscillating at the predetermined modulation frequency (corresponding to the encoded and modulated test signals). The constant component is thus provided to the integrated circuit ICA—which is also coupled with the reference voltage line 943 for receiving the reference voltage GND—and to a voltage converter circuit 946, such as a DC/DC converter.

The voltage converter circuit 946 converts the constant component received from the filter which corresponds to the supply voltage VCCA into the supply voltage VCCB for the integrated circuit ICB. According to an embodiment of the present invention, the semiconductor chip 906 further includes a mixer circuit 947 having a first input coupled with the filter circuit 945 for receiving the component oscillating at the predetermined modulation frequency and corresponding to the encoded and modulated test signals generated by the probe card 125, and a second input coupled with the converter circuit 946 for receiving the supply voltage VCCB. The mixer circuit 947 mixes the component oscillating at the predetermined modulation frequency with the (substantially constant) supply voltage VCCB, conveying the resulting signal to the semiconductor chip 912, for being separated, demodulated and decoded by a proper communication unit, in the same way as previously described in reference to the FIGS. 9A-9C. In this way, with the proposed solution it is possible to further reduce the number of probes required for testing a 3D IC structure that has to be supplied with different supply voltages.

According to a still further embodiment of the present invention, the supply voltage VCCB for the integrated circuit ICB may be supplied on the supply bus 942 by means of an alternating voltage having an oscillating frequency fp that is different than the ones used for conveying the encoded and modulated test signals. In this case, the converter circuit 946 will be an AC/DC converter, which converts the alternating voltage into the (constant) supply voltage VCCB, and the filter circuit 945 will be capable of separating the component of the signal conveyed by the supply bus 942 that oscillates at the frequency fp from the components oscillating at the frequencies corresponding to the encoded and modulated test signals.

In order to satisfy contingent and specific requirements, a person skilled in the art may apply to the solution described above many modifications and alterations. Particularly, although the present invention has been described with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

Although in the foregoing reference has been made to the use of a frequency-division multiplexing scheme, this is not to be considered as limitative for the present invention: any technique adapted mix different signal components so as to obtain a combined signal, allowing for a signal demixing in order to separate the different signal components can be used; similarly, any technique adapted to allow bidirectional communication over a same communication channel can be used (e.g. time-division multiplex).

Moreover, the proposed communication units may be also exploited for performing the final test of a chip included in a package, a Wafer Level Burn In (WLBI) test, an on-line test, or a final application test.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A test equipment for testing integrated circuits, comprising:
    a first probe adapted to contact a corresponding first contact terminal of an integrated circuit under test for establishing a first physical communication channel between the test equipment and the integrated circuit under test;
    a testing circuit electrically connected to said first probe and comprising:
        a transmitter circuit configured to simultaneously send to the integrated circuit under test, through the first probe and over said first physical communication channel, two test input stimuli signals using two carrier waves at different frequencies that are respectively modulated by the two test input stimuli signals; and
        a receiver circuit configured to receive from the integrated circuit under test two test response signals using two further carrier waves at different frequencies modulated by the two test response signals.

2. The test equipment of claim 1, wherein the two test response signals are received from the integrated circuit under test over either said first physical communication channel or a second physical communication channel different from the first physical communication channel;
    said receiver circuit comprising means for extracting the two test response signals from the modulated two further carrier waves; and
    the testing circuit further comprising means for assessing a proper functionality of the integrated circuit based on the extracted two test response signals.

3. The test equipment of claim 2, wherein the two further carrier waves modulated by the two test response signals are received from the integrated circuit under test over said first physical communication channel.

4. The test equipment of claim 2, wherein said second physical communication channel comprises a second probe, distinct from said first probe, adapted to contact a corresponding second contact terminal of the integrated circuit under test.

5. The test equipment of claim 1, comprising:
    means for supplying to the integrated circuit under test at least one power supply.

6. The test equipment of claim 5, wherein said means for supplying comprises a circuit configured to supply the power supply through said first probe combined with said two carrier waves modulated by the two test input stimuli signals.

7. The test equipment of claim 5, wherein said means for supplying the power supply comprises a second probe adapted to contact a corresponding power supply contact terminal of the integrated circuit under test to supply a first polarity of the power supply through said second probe.

8. The test equipment of claim 7, wherein said means for supplying the power supply further comprises a third probe adapted to contact a corresponding power supply contact terminal of the integrated circuit under test to supply a second polarity of the power supply to the integrated circuit under test.

9. The test equipment of claim 1, wherein the integrated circuit under test comprises:
    at least one integrated circuit core with said contact terminal adapted to be contacted by said first probe;

a built-in self-test circuit coupled to said at least one integrated circuit core and configured to perform a test based on the test input stimuli signals received from the test equipment.

10. The test equipment of claim 1, wherein said integrated circuit under test comprises:
means for receiving the two carrier waves modulated by the two test input stimuli signals;
means for extracting the two test input stimuli signals from the modulated two carrier waves; and
means for transmitting the two test response signals using the two further carrier waves modulated by the two test response signals.

11. The test equipment of claim 6, wherein said integrated circuit under test comprises:
means for separating the power supply from the first physical communication channel.

12. The test equipment of claim 1, wherein the integrated circuit under test comprises: a three dimensional integrated circuit structure comprising a sequence of stacked semiconductor chips starting from a bottom semiconductor chip and ending at a top semiconductor chip, each semiconductor chip comprising at least one respective integrated circuit, wherein the first probe is adapted to contact the corresponding first contact terminal located on one of the top or bottom semiconductor chips.

13. An apparatus, comprising:
a test equipment;
an integrated circuit under test;
wherein the test equipment comprises:
at least a first probe configured to contact a corresponding physical contact terminal of the integrated circuit under test and form a first physical communication channel; and
a first circuit configured to simultaneously transmit first and second test input stimulus signals through the first probe and over the first physical communications channel to the integrated circuit under test using first and second carrier waves modulated by the first and second test input stimulus signals; and
wherein the integrated circuit under test comprises:
a second circuit configured to perform a test based on the first and second test input stimulus signals received from the test equipment; and
a third circuit responsive to a result of the test performed by the second circuit and configured to transmit a response signal with said result of performing said test over the first physical communication channel and through the first probe to said test equipment using at least a third carrier wave modulated by said first response signal.

14. The apparatus of claim 13, wherein the integrated circuit under test comprises a three dimensional integrated circuit structure comprising a sequence of stacked semiconductor chips starting from a bottom semiconductor chip and ending at a top semiconductor chip, each semiconductor chip comprising at least one respective integrated circuit, and wherein said physical contact terminal is positioned on one of the bottom or top semiconductor chips.

15. The apparatus of claim 14, wherein the three-dimensional integrated circuit structure comprises at least one conductive through via crossing the semiconductor chips.

16. The apparatus of claim 13,
wherein the first circuit transmits the first and second test input stimulus signals over the first physical communication channel using the modulated first and second carrier waves at a first frequency and a second frequency, respectively; and
wherein the third circuit transmits the first response signal over said first physical communication channel using the modulated second carrier wave at a third frequency.

17. The apparatus of claim 16, wherein said third frequency is different from the first frequency.

18. The apparatus of claim 16, wherein the test circuit further comprises:
means for extracting the test response signal from the modulated third carrier wave at the third frequency; and
means for assessing a proper functionality of the integrated circuit under test based on the extracted test response signal.

19. The apparatus of claim 13, wherein the test equipment further comprises:
a second probe configured to contact a corresponding physical contact terminal of the integrated circuit under test and form a second physical communication channel; and
a fourth circuit configured to transmit a second test input stimulus signal over the second physical communications channel to the integrated circuit under test.

20. The apparatus of claim 13, wherein the test equipment further comprises means for supplying power to the integrated circuit under test.

21. The apparatus of claim 20, wherein said means for supplying power comprises means for transmitting power with the first and second test input stimulus signals over the first physical communication channel.

22. The apparatus of claim 21, wherein the integrated circuit under test comprises means for separating the test input stimulus from the transmitted supply of power and using the separated supply of power for powering circuitry of the integrated circuit under test.

23. The apparatus of claim 21, wherein the means for transmitting power comprises:
a power supply;
a voltage converter circuit operating responsive to said power supply to generate power; and
a circuit configured to provide said power over the first physical communication channel.

* * * * *

UNITED STATES PATENT AND TRADEMARK OFFICE
CERTIFICATE OF CORRECTION

Page 1 of 1

PATENT NO. : 9,442,159 B2
APPLICATION NO. : 13/716018
DATED : September 13, 2016
INVENTOR(S) : Alberto Pagani It is certified that error appears in the above-identified patent and that said Letters Patent is hereby corrected as shown below:

In the Specification:

At column 14, line number 59, please replace the word [alter] with -- filter --.

Signed and Sealed this
Eighteenth Day of October, 2016

Michelle K. Lee
*Director of the United States Patent and Trademark Office*